United States Patent
Sakuma et al.

[19]

[11] Patent Number: 5,936,423
[45] Date of Patent: Aug. 10, 1999

[54] SEMICONDUCTOR IC WITH AN OUTPUT CIRCUIT POWER SUPPLY USED AS A SIGNAL INPUT/OUTPUT TERMINAL

[75] Inventors: Yuji Sakuma; Masaaki Nariishi, both of Chiba, Japan

[73] Assignee: Kawasaki Steel Corporation, Kobe-shi, Japan

[21] Appl. No.: 08/766,341

[22] Filed: Dec. 16, 1996

[30] Foreign Application Priority Data

Dec. 14, 1995 [JP] Japan ..................... 7-325755

[51] Int. Cl.$^6$ ........................ H03K 19/00; H03K 19/0175
[52] U.S. Cl. ........................ 326/16; 326/82; 326/86; 326/49
[58] Field of Search ................ 326/82, 83, 86, 326/90, 49, 50, 121, 16

[56] References Cited

U.S. PATENT DOCUMENTS

| | | | |
|---|---|---|---|
| 4,996,453 | 2/1991 | Zanders et al. | 326/86 |
| 5,585,740 | 12/1996 | Tipon | 326/86 |
| 5,652,527 | 7/1997 | Phillips et al. | 326/83 |

FOREIGN PATENT DOCUMENTS

4-152714  5/1992  Japan .
6-77330   3/1994  Japan .

*Primary Examiner*—Michael Tokar
*Assistant Examiner*—Daniel D. Chang
*Attorney, Agent, or Firm*—Oliff & Berridge, PLC

[57] ABSTRACT

An object of the present invention is to decrease the number of terminals of a semiconductor integrated circuit by utilizing one terminal for a plurality of purposes, and reduce the cost of it, suppressing the performance degradation of the semiconductor integrated circuit. The present invention can be adapted to a semiconductor integrated circuit in which at least one of power supply terminals or ground terminals connected on a power supply path of an output circuit of the semiconductor integrated circuit is installed independently of a power supply path of an internal circuit. In a normal operation mode in which a test mode input terminal Φ is low, power is supplied to an output circuit 5 through an output circuit power supply/testing signal input terminal OVDD/TIN. In a test mode in which the test mode input terminal Φ is high, the output circuit power supply/testing signal input terminal OVDD/TIN is used to input a signal from outside of the integrated circuit or to output a signal sent from an internal circuit 3. In the test mode, a switching device SW1 on a final stage forming the output circuit is turned OFF by a cutoff circuit, and the terminal OVDD/TIN is disconnected from an output terminal U and can therefore be used as an input terminal for the testing signal.

20 Claims, 5 Drawing Sheets

SEMICONDUCTOR IC WITH AN OUTPUT CIRCUIT POWER SUPPLY USED AS A SIGNAL INPUT/OUTPUT TERMINAL

BACKGROUND OF THE INVENTION

1. Field of the Invention

The present invention relates to a semiconductor integrated circuit in which at least one of power supply terminals or ground terminals connected on a power supply path of an output circuit for driving a signal to the outside of the integrated circuit is installed independently of a power supply path of an internal circuit responsible mainly for logic operations. More particularly, this invention is concerned with the integrated circuit in which the cost of a semiconductor integrated circuit can be reduced by decreasing the number of terminals associated with signals which are employed in a special state as a test or the like or used for newly added functions.

2. Description of the Related Art

In recent years, semiconductor integrated circuits have had the tendency toward higher integration and higher multifunctionality. Labor and cost of a test for checking if a manufactured integrated circuit operates normally are increasing accordingly. For carrying out such a test on a semiconductor integrated circuit, special signals for the test are employed in general. For example, a terminal for inputting a mode change signal for changing an operation mode to a test mode, and a terminal used to input a test signal for some test from the outside of the integrated circuit or a terminal used to output a signal from the integrated circuit under a test to outside are needed.

These terminals employed in the test become unnecessary for actual use (normal operation mode) of the integrated circuit after completion of the test that is an original object of the terminals. Moreover, if the number of terminals unnecessary in the normal operation mode is large, various problems occur. For example, it becomes hard to design a package compactly.

The present invention does not restrict an object of test on a semiconductor integrated circuit to any specific test. Moreover, the test is not limited to literally a test on a semiconductor integrated circuit but may be concerned with a special state analogous to a testing state. A general test requires terminals for inputting and outputting some test signals or a terminal for inputting or outputting a test signal bidirectionally.

For example, there is a standby current measurement that is one testing method for a semiconductor integrated circuit such as an LSI. This standby current measurement is such that a logical state to be input to a semiconductor integrated circuit that is an object of the measurement, a logical state to be output from it, or a logical state of the inside of the integrated circuit is set to a steady-state, and a supply current in the steady state is measured. In a complementary metal oxide semiconductor (CMOS) type integrated circuit, a leakage current flowing when a MOS transistor included is OFF can be measured. Through the measurement, the presence or absence of a MOS transistor deteriorated or failed can be judged.

Talking of a defect of a semiconductor integrated circuit, for example, if the circuit is cleaned insufficiently in the course of manufacturing or a foreign substance adheres to the circuit, the operational characteristic of the circuit may be degraded or the circuit may become completely defective some days later. In this case, the standby current measurement can be adopted for detecting a leakage current and thus judging if the circuit is defective.

The standby current measurement may be referred to as an IDDQ test or steady-state current IDDQ measurement test. An evaluation testing pattern adopted for this kind of test is selected from among, for example, numerous testing patterns designed for functional tests by users. However, if a current larger than a leakage current flows for some reason, for example, a current flows into a pull-up resistor as described later, some of the evaluation testing patterns are ineffective in detecting the leakage current hidden behind the large current. When a pull-down resistor is employed, if a current flows into the pull-down resistor, the leakage current cannot be detected successfully. A testing pattern causing a large current to flow or a circuit pattern causing the operation of a circuit to become unstable cannot be adopted.

For a circuit having a pull-up resistor, the standby current measurement must be carried out with the logical state of a pulled-up portion of the circuit set to a high-level state. For a circuit having a pull-down resistor, the standby current measurement must be carried out with the logical state of a pulled-down portion of the circuit set to a low-level state. It is therefore very difficult to produce a testing pattern to be used for the standby current measurement.

For reliably finding out the presence of a deteriorating or failing transistor or the like through standby current measurement, a static current should preferably be able to be measured with each node set high or low. However, when each node is set high or low, if a current flows into a pull-up resistor as mentioned above, the static current cannot be measured.

Japanese Patent Publication No. Hei 4-152714 has disclosed an art in which a control signal terminal is included to give control signal so that a pull-up resistor or a pull-down resistor is disconnected at the time of standby current measurement to prevent a current from flowing into the pull-up resistor or pull-down resistor during the standby current measurement. According to this Japanese Patent Publication, for example, a p-channel MOS transistor or an n-channel MOS transistor to be turned ON or OFF in response to a signal applied to the control signal terminal is used to disconnect the pull-up resistor or pull-down resistor at the time of the standby current measurement. Since no current flows into the pull-up resistor or the pull-down resistor during the standby current measurement, any of testing patterns can be selected more freely.

By contrast, a method referred to a scan path method is adopted for simplifying a test on a semiconductor integrated circuit such as an LSI. The scan path method is such that all flip-flops in a circuit are isolated from normal circuit connections at the time of testing, and used as one long shift register. In this method, an access to each flip-flop during testing is completed as one shift registor.

For example, all flip-flops are operated as one shift register, and a desired testing pattern is input serially. For reading the logical states of the flip-flops, all the flip-flops are operated as one shift register, and the logical states shift successively.

In general, a logic circuit can be classified into a sequential circuit such as a flip-flop or counter and a combinational circuit such as a gate. In the scan path testing method, a logic circuit can be tested by dividing it into a part of sequential circuit and a part of combinational circuit, and then subjected to a test.

By contrast, a known method of testing a semiconductor integrated circuit such as an LSI includes a method using a so-called boundary scan register.

This method is such that boundary scan registers are connected in advance to an input or output terminal or the inside of a logic circuit to be tested, such as, a user circuit. In setting the logical state of the input or output terminal of the logic circuit to be tested, or in reading the logical state of it, access is carried out via the boundary scan registers.

A general boundary scan register is composed mainly of a flip-flop and multiplexer. For setting a logical state, the multiplexers in respective boundary scan registers are switched so that the numerous boundary scan registers constitute one long shift register. A serial data pattern is input while being successively shifted from one of the boundary scan registers constituting the shift register to another, whereby the logical states of the respective boundary scan registers can be set.

For reading the logical states of the boundary scan registers, the multiplexers in the boundary scan registers are switched so that the numerous boundary scan registers constitute one long shift register. Data is successively shifted from one of the boundary scan registers constituting the shift register to another, whereby the logical states of the boundary scan registers are read successively to the outside of the semiconductor integrated circuit.

The standby current measurement method, the scan path method, and the testing method using boundary scan registers have been described as methods of testing a integrated circuit such as an LSI. The present invention is not limited to these methods. Almost all methods of testing a integrated circuit including these methods use special signals for testing.

For example, in the scan path method, as mentioned above, at least a signal for changing all flip-flops in a circuit to be tested to a long shift register is needed. The testing method using boundary scan registers requires a signal for switching multiplexers in boundary scan registers. In the standby current measurement, generally, a signal dedicated to testing is needed as described in the Japanese Patent Publication No. Hei 4-152714.

Figure 10:
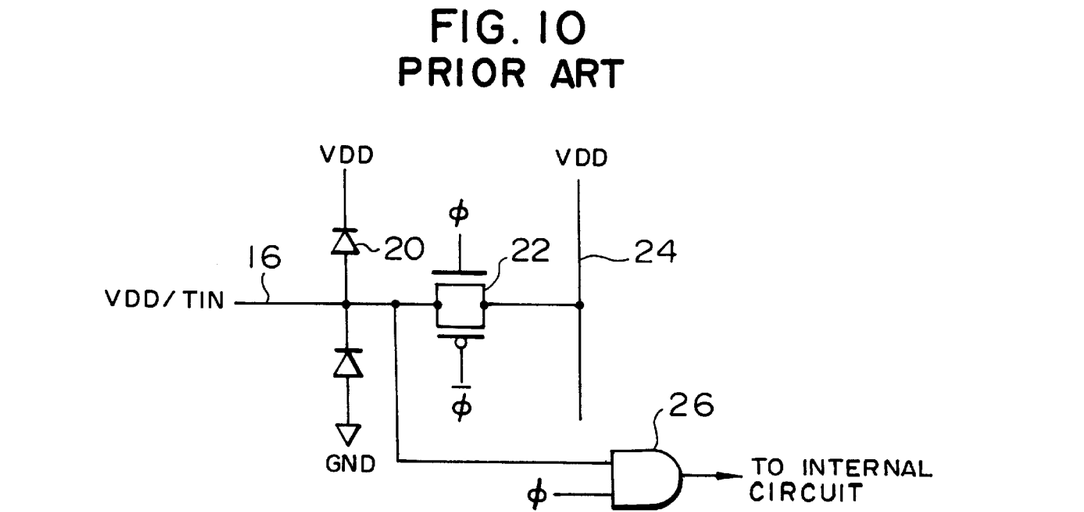
FIG. 10 is a circuit diagram of a major portion concerning a prior art in which a terminal is used for supplying power in a normal operation mode and for inputting a testing signal in a test mode.

Japanese Patent Publication No. Hei 6-77330 has disclosed an art in which a circuit shown in FIG. 10 is used to decrease the number of signal terminals employed in a test on a semiconductor integrated circuit.

According to the Japanese Patent Publication No. 6-77330, included are a mode change terminal Φ for changing an operation mode in which a circuit performs a given operation to a test mode in which the circuit performs a testing operation, and a power supply terminal VDD and a ground terminal GND to which given power supply voltages are applied. In addition to these terminal, a power supply/ testing terminal 16 (VDD/TIN in FIG. 10 connected in parallel with a power supply terminal VDD) is included. In the operation mode, the given power supply voltage is applied to the power supply/testing terminal 16 in parallel with the power supply terminal or the ground terminal. In the test mode, the power supply/testing terminal 16 is disconnected from the power supply terminal or the ground terminal by a switching circuit 22 so that a testing signal can be input or output through the terminal.

In FIG. 10, there are shown a power line 24, a protective circuit 20 composed of two diodes, and a gate circuit 26 for supplying a signal to an internal circuit in the test mode.

In the Japanese Patent Publication No. Hei 6-77330, the switching circuit 22 (test selection switch) is placed between the power line 24 and power supply/testing terminal 16 in order to use the terminal 16 as a testing input terminal in the test mode. By contrast, in the normal operation mode, the terminal 16 is used as to a power line 24 for supplying power. The terminal employed in the special state in which a test or the like is carried out is utilized for supplying power in the normal operation mode. As a result, the number of terminals that become unnecessary in the normal operation mode can be decreased.

However, in the normal operation mode, although the terminal 16 is used as a terminal for supplying power, the switching circuit 22 is inserted on a power supply path. Even when the switching circuit 22 is ON, some ON-state resistance exists in the switching circuit 22. This causes a problem that the regulation in power supply deteriorates due to a voltage drop. The deterioration results in some performance degradation of the integrated circuit.

SUMMARY OF THE INVENTION

The present invention attempts to solve the foregoing problems underlying the prior arts. An object of the present invention is to suppress the performance degration of a semiconductor integrated circuit in a normal state, decrease the number of terminals of the semiconductor integrated circuit to be associated with signals used in such a special state and used for newly added functions, and thus reduce the cost of the semiconductor integrated circuit.

For accomplishing the above object, the present invention provides a semiconductor integrated circuit in which at least one of power supply terminals or ground terminals connected on a power supply path of an output circuit portion for driving a signal to be output to the outside of the semiconductor integrated circuit is installed independently of a power supply path of an internal circuit portion responsible mainly for signal processing or logic operations, and in which the at least independent part of the power supply terminals or the ground terminals of the output circuit is used as a testing signal terminal in a test mode.

In the semiconductor integrated circuit, the output circuit includes a first switching device to be turned ON or OFF for switching the connection between a power supply of the output circuit and an output terminal, and a second switching device to be turned ON or OFF for switching the connection between the output terminal and a ground. The output circuit outputs a signal to outside through ON-OFF control of the switching devices. A test mode input terminal through which a signal indicating whether or not the test mode is designated is input is included, and a power cutoff circuit is included for placing the first switching device or the second switching device of the output circuit in a normally-OFF state in the test mode. In the test mode, an output of the output circuit is of an open drain type. Thus, the aforesaid problems are solved.

The first and the second switching devices may be formed with bipolar transistors or MOS transistors but are not limited to the same type of transistors as the type of transistors constituting an integrated circuit.

When MOS transistors are employed, it is preferred that the first switching device is a p-channel MOS transistor and the second switching device is an n-channel MOS transistor.

In the semiconductor integrated circuit, a third switching device to which power is supplied through another path is included for supplementing the operation of the first switching device or the second switching device that is placed in a normally-OFF state in the test mode irrespective of an input signal in the output circuit. An output of the output circuit in the test mode is not of an open drain type but of a general output type with a low or high level.

The operation of the present invention will be described briefly.

In recent semiconductor integrated circuits, at least part of a power supply path of an output circuit portion (hereinafter, an output circuit power supply path) is installed independently of a power supply path of an internal circuit portion (hereinafter, an internal circuit power supply path) responsible mainly for logic operations.

This is intended to prevent mutual interferences like a noise between these power supply paths.

Generally, a plurality of power supply terminals and ground terminals are arranged on the output circuit power supply path when they are made independent of a power supply terminal and a ground terminal dedicated to the internal circuit power supply path. This is because the inclusion of the plurality of power supply terminals and ground terminals leads to improvement of the regulation in power supply, and helps the output circuit maintain the ability to drive external routing lines of the semiconductor integrated circuit, retain a given output delay, and finally set an output value to a high-level or low-level value within a delay time requested under the specifications for the semiconductor integrated circuit.

According to the present invention, any of the pluralities of power supply terminals and ground terminals on the output circuit power supply path is used as an input/output terminal for a testing operation signal. Consequently, the total number of terminals can be decreased.

If the device area constituting an LSI is smaller than the smallest chip area determined by the number of bonding pads arranged along the periphery of a chip, the chip area can be reduced by decreasing the number of pads. Consequently, the manufacturing cost can be reduced. Moreover, a package having a smaller number of pins can be used to mount the LSI chip. Consequently, the cost of the package can be reduced.

In the present invention, at least part of power supply terminals or ground terminals included in a semiconductor integrated circuit, which is part of an output circuit power supply path, is used as a testing signal terminal, that is, a testing signal input terminal, testing signal output terminal, or a bidirectional testing signal input/output terminal in a test mode that is not a normal operation mode. However, according to the present invention, needless to say, the part of power supply terminals or ground terminals can be used as an input/output terminal for a more general-purpose signal other than the testing signal.

Herein, what is referred to as a terminal of a semiconductor integrated circuit shall have both the meanings of a bonding pad formed on a semiconductor integrated circuit chip and a pin of a package on which the chip is mounted.

DESCRIPTION OF THE PREFERRED EMBODIMENTS

Referring to the appended drawings, the present invention will be described in detail.

Figure 1:
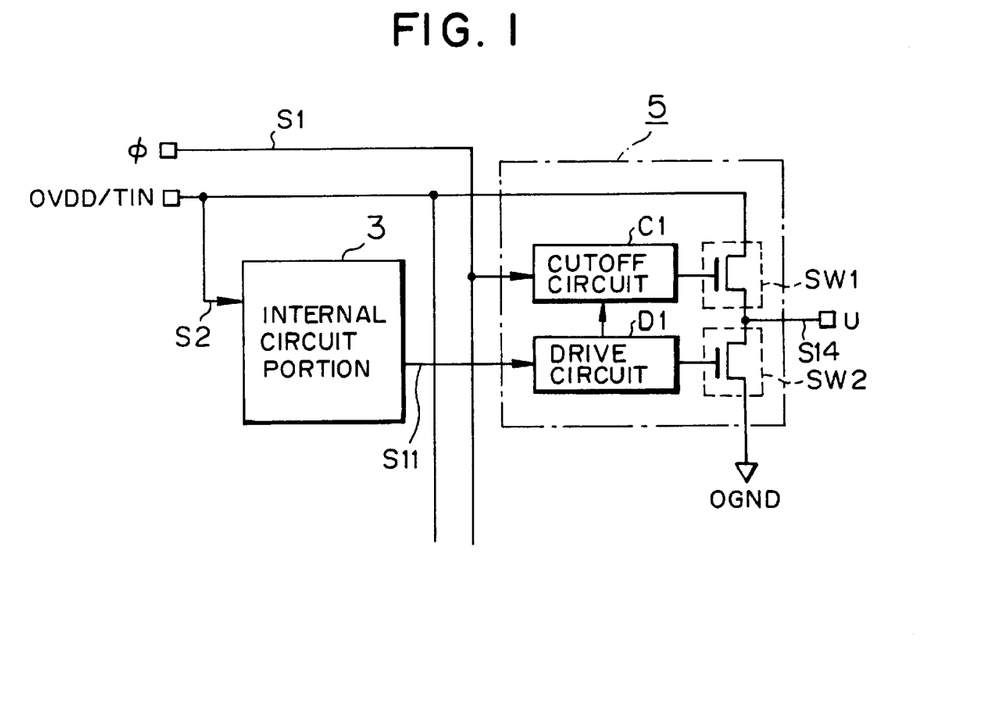
FIG. 1 shows a model of a portion, in which the present invention is implemented, of a semiconductor integrated circuit of the first embodiment to which the present invention is adapted.

To begin with, FIG. 1 shows a model of a semiconductor integrated circuit of the first embodiment to which the present invention is adapted, centering on a portion thereof in which the present invention is implemented.

In FIG. 1, there is shown a test mode input terminal Φ through which a signal indicating whether or not a test mode is designated is input. Moreover, an output circuit power supply/testing signal input terminal OVDD/TIN is included for becoming a power supply path of an output switching device SW1 in a normal operation mode, and for inputting some signal concerning a test in the test mode. Also included is an output terminal U through which an output circuit 5 outputs a signal to the outside of a semiconductor integrated circuit according to a signal sent from an internal circuit portion 3. The output circuit 5 is composed of a drive circuit D1 for driving the output switching devices SW1 and SW2 in response to a signal sent from the internal circuit 3, a cutoff circuit C1 for controlling the switching device SW1 so as to cut off the output terminal U from the terminal OVDD/TIN in response to a test mode signal Φ, and the switching devices SW1 and SW2. A plurality of output circuits that are not shown may be connected to the test mode input terminal Φ and terminal OVDD/TIN in parallel with the output circuit 5.

The operations will be described. To begin with, in the normal operation mode that is not the test mode, a signal input through the test mode input terminal Φ is low. Power is applied to the terminal OVDD/TIN.

According to a signal S11 sent from the internal circuit portion 3, the drive circuit drives the switching device SW2, and drives the switching device SW1 via the cutout circuit C1. At this time, when the switching device SW1 is turned ON according to the internal signal S11, the switching device SW2 is operated complementarily, that is, turned OFF. The output circuit thus outputs a signal to outside.

Next, in the test mode, a signal S1 input through the test mode input terminal Φ is high. A signal S2 used for a test is input to the internal circuit 3 through the terminal OVDD/TIN. In response to the signal S1, the cutoff circuit C1 operates to disconnect the terminal OVDD/TIN from the output terminal U. The switching device SW1 is normally-OFF irrespective of the signal S11 output from the internal circuit 3, and the output circuit 5 operates as an open drain type circuit.

Herein, bipolar transistors may be used as the switching devices SW1 and SW2, or MOS transistors may be. Any other devices may be employed as long as they operate similarly.

As mentioned above, according to the present invention, in the normal operation mode, power is supplied to the switching device SW1 through the terminal OVDD/TIN, and a signal S11 sent from the internal circuit 3 is output to outside through the output terminal U. By contrast, in the test mode, a signal S2 is input to the internal circuit 3 through the terminal OVDD/TIN. Thus, a terminal used to input a signal required in the test mode can be provided.

In the test mode, the signal S11 from the internal circuit 3 can be output through the output terminal U via the output circuit 5 that operates as an open drain type circuit. There is no problem in terms of external monitoring of a logical state. Despite the open drain type output, as long as an integrated circuit tester used for testing can cope with the output, a failure in the internal circuit can usually be detected in the same manner as that when an ordinary output circuit is employed.

Figure 2:
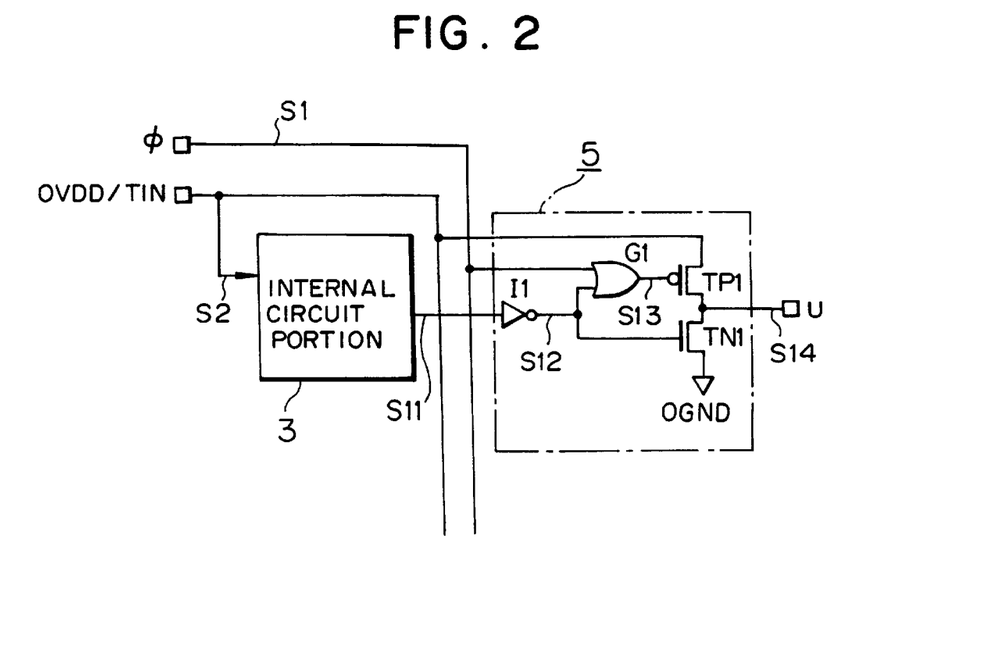
FIG. 2 shows an example of an exemplary circuit of the first embodiment of the present invention.

FIG. 2 shows an example of an exemplary circuit of the first embodiment. A p-channel MOS transistor TP1 is used as the switching device SW1, and an n-channel MOS transistor TN1 is used as the switching device SW2. An inverter I1 is used as the drive circuit, and a dual-input OR gate G1 is used as the cutout circuit. The other components are identical to those in FIG. 1. The operations of the circuit will be described below.

In the normal operation mode, a signal $\Phi$ is driven low. Since power is applied to the terminal OVDD/TIN, the dual-input OR gate G1 operates as a mere buffer. A signal S11 from the internal circuit is reversed by the inverter I1 and then taken out as a normal CMOS type output composed of the transistors TP1 and TN1.

In the test mode, the signal $\Phi$ is driven high. An output S13 of the dual-input OR gate G1 goes normally-high, whereby the p-channel MOS transistor TP1 is turned OFF. The output terminal U is therefore not affected by the terminal OVDD/TIN. A signal S2 used for a test is input to the internal circuit 3 through the terminal OVDD/TIN. An output S11 of the internal circuit 3 causes the inverter I1 to drive the n-channel MOS transistor TN1, and is then taken out as an open drain type output through the terminal U.

Figure 3:
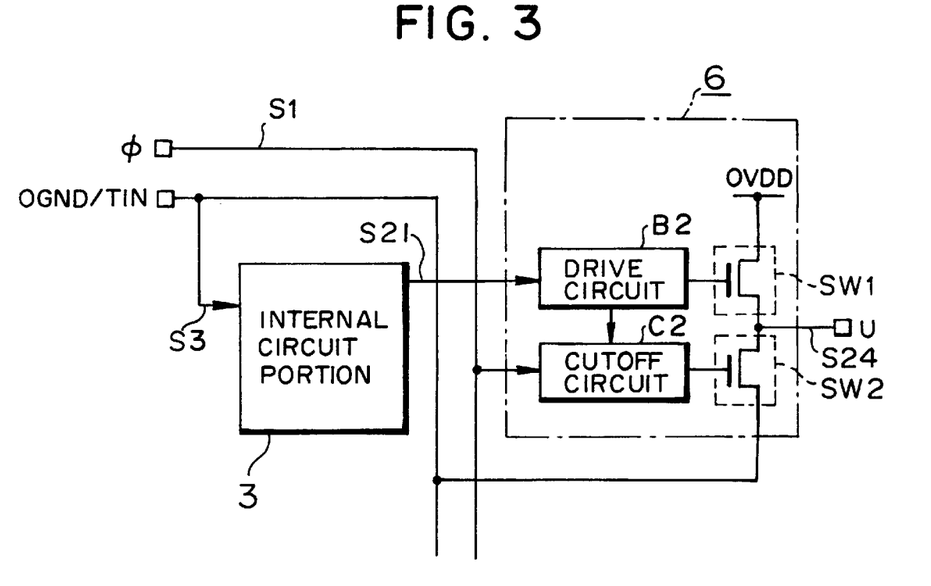
FIG. 3 shows a model of a portion, in which the present invention is implemented, of a semiconductor integrated circuit of the second embodiment to which the present invention is adapted.

FIG. 3 shows a model of a semiconductor integrated circuit of the second embodiment to which the present invention is adapted, or especially, a portion thereof in which the present invention is implemented. In this embodiment, a ground terminal connected to the output switching device SW2 is used as an input terminal OGND/TIN for a testing signal. A cutoff circuit C2 is included for controlling the switching device SW2. An independent power supply OVDD is used to supply power to the switching device SW1. The other components are identical to those in the first embodiment.

The second embodiment will be described in more detail using an example of an exemplary circuit of the second embodiment shown in FIG. 4.

Figure 4:
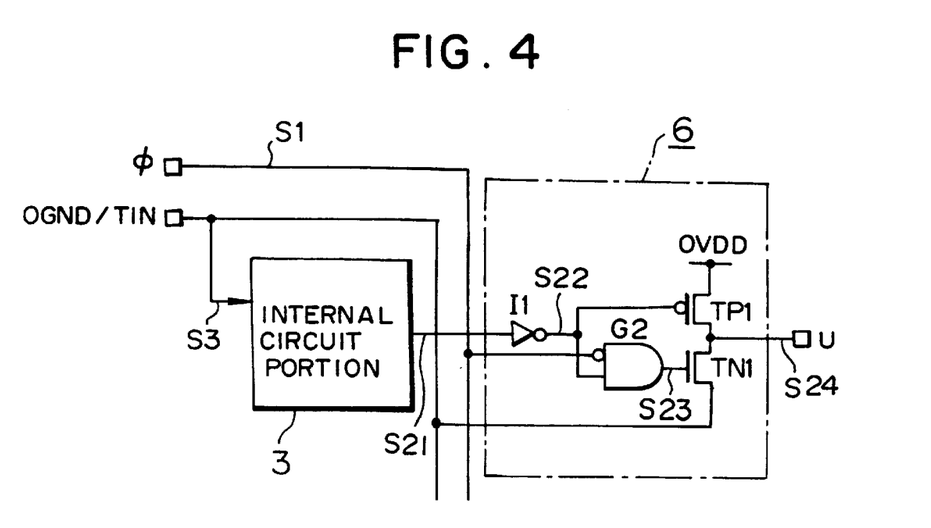
FIG. 4 shows an example of an exemplary circuit of the second embodiment of the present invention.

In FIG. 4, there are shown an internal circuit portion 3 responsible mainly for logic operations, and an output circuit 6 for driving and outputting a signal to the outside of the semiconductor integrated circuit according to a signal sent from the internal circuit 3. The output circuit is composed of an inverter I1 serving as a driver, AND gate G2, p-channel MOS transistor TP1, and n-channel MOS transistor TN1.

To begin with, in a normal operation mode, a signal S1 input through the test mode input terminal $\Phi$ is driven low. In this case, the AND gate G2 operates as a mere buffer. A signal S21 from the internal circuit passes through the inverter I1 and is then taken out as a normal CMOS type output.

By the way, in a test mode in which the signal S1 input through the test mode input terminal $\Phi$ is driven high, the terminal OGND/TIN is used as an input terminal for a signal used in the test mode. A signal S3 is input from the outside of the semiconductor integrated circuit to the internal circuit 3. In this test mode, since the signal S1 coming through the test mode input terminal $\Phi$ is high, a signal S23 output from the AND gate G2 goes low. The n-channel MOS transistor TN1 becomes normally-OFF. In other words, despite the signal S21 output from the internal circuit portion 3, the n-channel MOS transistor TN1 becomes normally-OFF. Even in the test mode, the p-channel MOS transistor TP1 is turned ON or OFF according to the signal S21. When the signal S21 is low, the transistor TP1 is OFF. When the signal S21 is high, the transistor TP1 is ON. Thus, in the test mode, the signal S21 sent from the internal circuit 3 is output through the output terminal U from the open drain type output circuit in which the drain of the p-channel MOS transistor TP1 is open.

As described above, in this embodiment, the signal S3 used in the test mode can be input by employing a terminal, which is used to supply power to an output circuit in the normal operation mode, as a signal input terminal.

Figure 5:
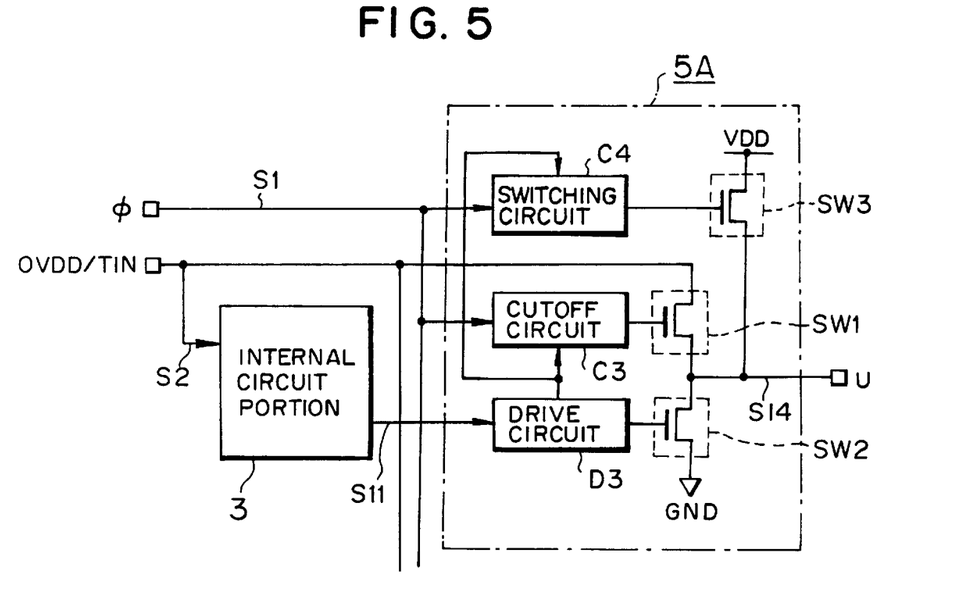
FIG. 5 shows a model of a portion, in which the present invention is implemented, of a semiconductor integrated circuit of the third embodiment to which the present invention is adapted.

FIG. 5 shows a model of a semiconductor integrated circuit of the third embodiment to which the present invention is adapted, centering on a portion in which the present invention is implemented.

An output circuit 5A in this embodiment has the same components as the output circuit 5 in the first embodiment shown in FIG. 1, and further includes a third switching device SW3, and a switching circuit for determining depending on a normal operation mode or test mode whether or not the switching device SW3 should be operated by the drive circuit. The third switching device SW3 is, as illustrated, connected between a power supply VDD for the internal circuit 3 and the output terminal.

The third switching device SW3 may be connected between another power supply OVDD to which power is applied externally even in the test mode and the output terminal.

In this embodiment, in the test mode, the switching device SW3 is operated on behalf of the switching device SW1 that is disconnected from the terminal OVDD/TIN or output terminal U by means of the cutoff circuit. Since the switching device SW3 does not use the terminal OVDD/TIN as a power supply, even if the switching device SW3 operates on behalf of the switching device SW1, a testing function will not be affected at all. Owing to the operation of the switching device SW3, it will not take place that the output circuit 5A operates as an open drain type circuit in the test mode. This is convenient in monitoring a signal output through the output terminal U.

In FIG. 5, it is determined depending on the signal $\Phi$ whether or not an output of the drive circuit is transmitted to the switching device SW3. Alternatively, like an embodiment to be described later (FIG. 7), the switching device SW3 may always be driven by the drive circuit irrespective of the signal $\Phi$. The same operation can still be accomplished.

This embodiment will be described in more detail using an exemplary circuit of the embodiment shown in FIG. 6.

Figure 6:
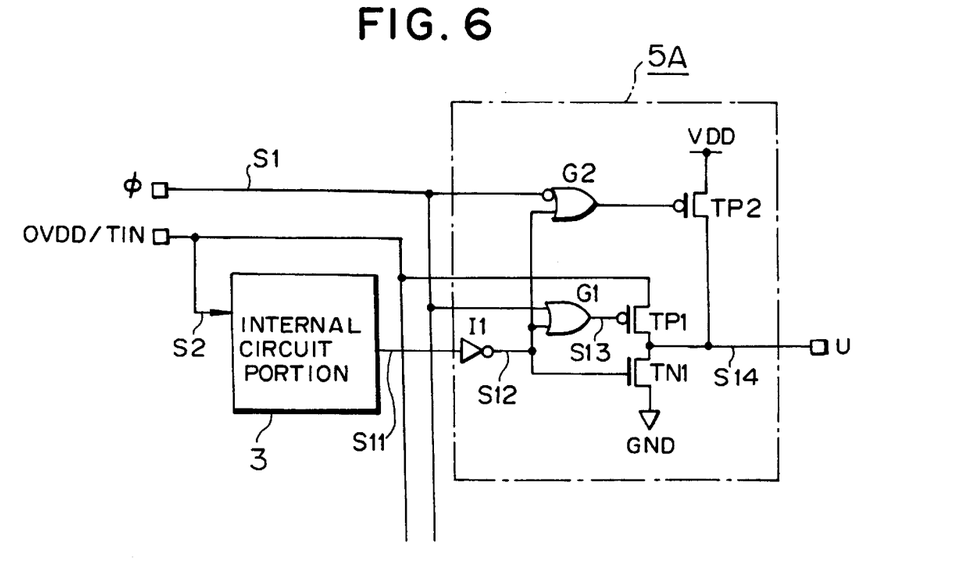
FIG. 6 shows an example of an exemplary circuit of the third embodiment of the present invention.

An output circuit shown in FIG. 6 has the same components as the output circuit 5 shown in FIG. 2, and further includes an OR gate G2 and a p-channel MOS transistor TP2. The drain of the p-channel MOS transistor TP2 is linked to the power supply VDD used by the internal circuit 3. In this circuit, in the test mode in which the signal S1 input through the test mode input terminal Φ is high, the OR gate G2 acts as a mere buffer.

In the test mode, if the signal S11 output from the internal circuit 3 is low, the signal S12 output from the inverter I1 goes high. The p-channel MOS transistor TP2 is turned OFF. At this time, the n-channel MOS transistor TN1 is turned ON and the signal S14 is driven low.

By contrast, when the signal S11 is driven high, the signal S12 goes low. The p-channel MOS transistor TP2 is turned ON. The n-channel MOS transistor TN1 is turned OFF, and the signal S14 is driven high.

As mentioned above, in this circuit, although power is supplied to the output circuit through the output circuit power supply/testing signal input terminal OVDD/TIN in the normal operation mode, power is supplied from another power supply in the test mode. Even in the test mode, the output circuit therefore operates as a CMOS logic gate but does not operate as an open drain type circuit.

Normally, the p-channel MOS transistor TP2 is made smaller than the p-channel MOS transistor TP1. The operating speed of the output circuit during testing therefore decreases. However, there is no problem as long as the operating speed of the whole circuit is made lower in the test mode and the load on the output circuit 5A is lightened. The decrease in the operating speed would rather be suppressed.

As mentioned previously, in the test mode, the output circuit uses another power supply. The regulation of a power supply may presumably deteriorate a bit. However, consideration may be taken into this point for testing. Consequently, no problem occurs.

Figure 7:
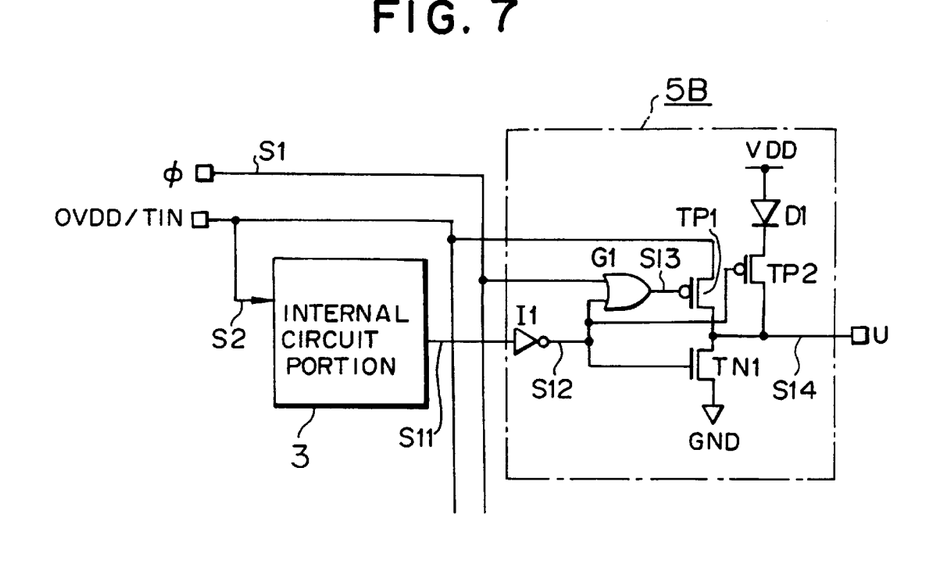
FIG. 7 shows another example of the exemplary circuit of the third embodiment of the present invention.

FIG. 7 shows another example of the exemplary circuit of the third embodiment of the present invention.

In an output circuit 5B in this circuit, the OR gate G2 shown in FIG. 5 is excluded, an output S12 of the inverter I1 is fed directly to the gate of the p-channel MOS transistor TP2. In the drawing, a diode D1 is inserted between the power supply VDD and p-channel MOS transistor TP2. The diode D1 may not be included.

Figure 8:
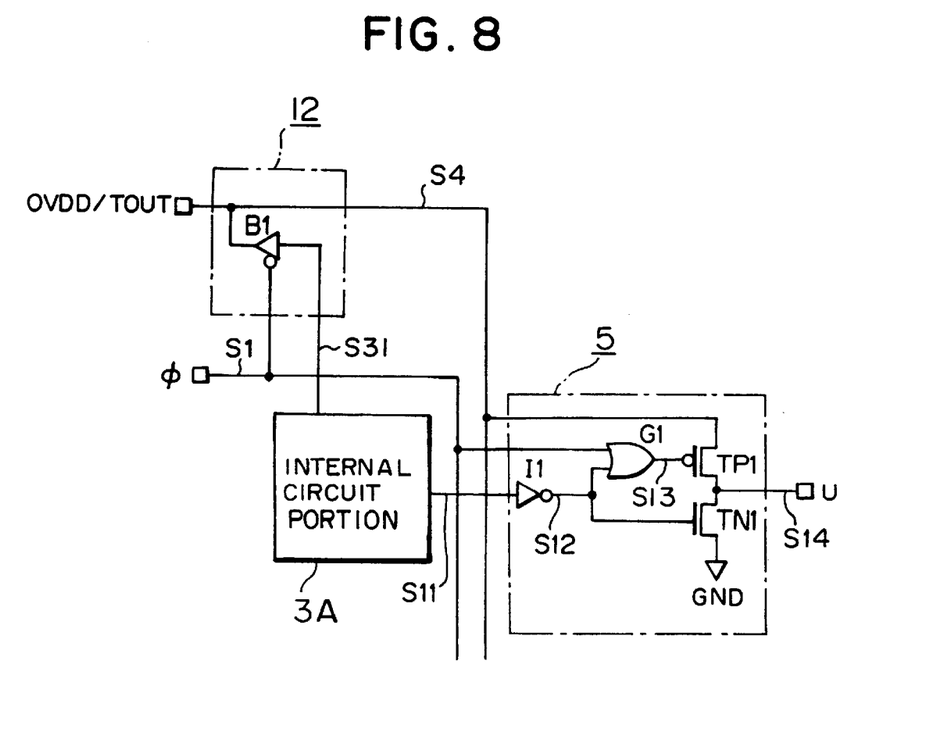
FIG. 8 shows an example of an exemplary circuit of the fourth embodiment of the present invention.

FIG. 8 shows an example of an exemplary circuit of the fourth embodiment of the present invention.

In the embodiment shown in FIG. 8, an output circuit power supply/testing signal output terminal OVDD/TOUT is substituted for the output circuit power supply/testing signal input terminal OVDD/TIN in the first embodiment. In the normal operation mode, power is supplied to the output circuit 5 through the terminal OVDD/TOUT. By contrast, in the test mode, the terminal is used to output a signal S31 from an internal circuit 3A to outside via an output buffer 12 that is a tristate buffer B1.

Thus, according to this embodiment, a terminal used to supply power to the output circuit portion 5 in the normal operation mode can be utilized to output a signal used for testing in the test mode.

Figure 9:
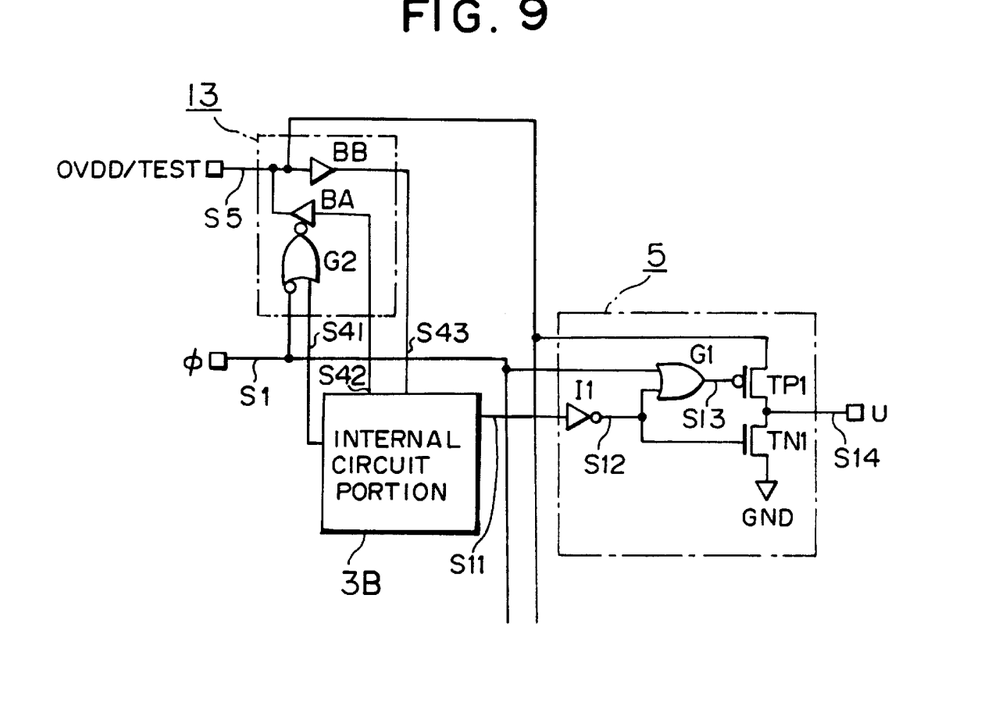
FIG. 9 shows an example of an exemplary circuit of the fifth embodiment of the present invention.

FIG. 9 shows an example of an exemplary circuit of the fifth embodiment of the present invention.

An output circuit power supply/testing signal input/output terminal OVDD/TEST in this circuit is equivalent to the output circuit power supply/testing signal input terminal OVDD/TIN in the first embodiment and to the output circuit power supply/testing signal output terminal OVDD/TOUT in the fourth embodiment. The terminal OVDD/TEST in this embodiment is used to supply power to the output circuit 5 in the normal operation mode. In the test mode, a buffer BB in an input/output buffer 13 is used to input a signal S43 to an internal circuit 3B. A tristate buffer BA and OR gate G2 are used to output a signal S42 of the internal circuit 3B. Validating or invalidating the output of the signal S42 is controlled with a signal S41 output from the internal circuit 3B.

According to this embodiment, in the test mode, a terminal used to supply power to the output circuit 5 in the normal operation mode can be utilized as a bidirectional terminal through which a signal is input or output in the test mode.

As described so far, according to the present invention, excellent advantages can be exerted: the performance degradation of a semiconductor integrated circuit in a normal state can be suppressed; the number of terminals of the semiconductor integrated circuit associated with signals employed in a special state in which a test or the like is carried out or for signals employed in newly-added functions can be decreased; and eventually cost can be reduced.

What is claimed is:

1. A semiconductor integrated circuit having an interconnected internal circuit and output circuit in which at least one power supply terminal or ground terminal connected with a power supply path of the output circuit is installed independently of a power supply path of the internal circuit, said at least one power supply terminal or ground terminal being operable as a signal terminal for inputting or outputting a signal.

2. A semiconductor integrated circuit, comprising:
   an internal circuit responsible mainly for signal processing and logic operations;
   at least one output circuit including a first switching device to be turned ON or OFF for switching the connection between an output power supply and an output terminal, and a second switching device to be turned ON or OFF for switching the connection between the output terminal and an output ground, and outputting a signal to outside through conduction or non-conduction of the switching devices, said at least one output circuit having the output power supply or the output ground independently of a power supply or a ground of said internal circuit;
   a test mode input terminal through which a signal indicating whether or not a test mode is designated is input;
   an output circuit power supply/signal input/output terminal connected on a power supply path of said output circuit, used as the output power supply or the output ground of said output circuit in a normal operation mode, and used as a terminal for inputting or outputting a signal in a test mode; and
   a power cutoff circuit for turning OFF said first switching device or second switching device in the test mode.

3. An integrated circuit according to claim 2, wherein said first and second switching devices are formed with bipolar transistors.

4. An integrated circuit according to claim 2, wherein said first and second switching devices are formed with MOS transistors.

5. An integrated circuit according to claim 4, wherein said first switching device is a p-channel MOS transistor, and said second switching device is an n-channel MOS transistor.

6. An integrated circuit according to claim 5, wherein said output circuit power supply/signal input/output terminal is used as a power supply of said output circuit, said power supply cutoff circuit is a dual-input OR gate for cutting off an output p-channel MOS transistor, and a test mode input signal and a reverse signal of an internal signal to be output are input to the dual-input OR gate.

7. An integrated circuit according to claim 5, wherein said output circuit power supply/signal input/output terminal is used as the output ground of said output circuit, said power cutoff circuit is a dual-input AND gate for cutting off an output n-channel MOS transistor, and a reverse signal of a test mode input signal and a reverse signal of an internal signal to be output are input to the dual-input AND gate.

8. A semiconductor integrated circuit according to claim 2, further comprising a third switching device to be connected between a power supply or a ground other than the output power supply or the output ground of said output circuit and said output terminal, wherein said third switching device performs switching on behalf of said first or second switching device to be cut off in the test mode.

9. An integrated circuit according to claim 8, wherein said first, second, and third switching devices are formed with bipolar transistors.

10. An integrated circuit according to claim 8, wherein said first, second, and third switching devices are formed with MOS transistors.

11. An integrated circuit according to claim 10, wherein said first switching device is a p-channel MOS transistor, said second switching device is an n-channel MOS transistor, and said third switching device is a p-channel MOS transistor.

12. An integrated circuit according to claim 11, wherein said output circuit power supply/signal input/output terminal is used as the output power supply of said output circuit, said power cutoff circuit is a dual-input OR gate for cutting off the output p-channel MOS transistor, and a test-mode input signal and a reverse signal of an internal signal to be output are input to said dual-input OR gate.

13. A semiconductor integrated circuit according to claim 2, further comprising an output buffer circuit, connected to said output circuit power supply/signal input/output terminal, for outputting a signal output from said internal circuit to outside through said terminal in the test mode, and disconnected from said terminal in the normal operation mode.

14. An integrated circuit according to claim 13, wherein said first and second switching devices are formed with MOS transistors.

15. An integrated circuit according to claim 14, wherein said output buffer circuit connected to said output circuit power supply/signal input/output terminal is a tristate buffer.

16. A semiconductor integrated circuit according to claim 8, further comprising an output buffer circuit, connected to said output circuit power supply/signal input/output terminal, for outputting a signal output from said internal circuit to outside through said terminal in the test mode, and disconnected from said terminal in the normal operation mode.

17. An integrated circuit according to claim 16, wherein said first, second, and third switching devices are formed with MOS transistors.

18. A semiconductor integrated circuit according to claim 13, wherein said output buffer circuit is controlled with a test mode signal and internal circuit signal, and an output switching circuit is included for controlling connection or disconnection of said output buffer circuit to or from said output circuit power supply/signal input/output terminal.

19. An integrated circuit according to claim 17, wherein said first switching device is a p-channel MOS transistor, said second switching device is an n-channel MOS transistor, and said third switching device is a p-channel MOS transistor.

20. A semiconductor integrated circuit according to claim 16, wherein said output buffer circuit is controlled with a test mode signal and internal circuit signal, and an output switching circuit is included for controlling connection or disconnection of said output buffer circuit to or from said output circuit power supply/signal input/output terminal.

* * * * *